(12) United States Patent
Kuo

(10) Patent No.: US 11,176,908 B1
(45) Date of Patent: Nov. 16, 2021

(54) METHOD FOR REDUCING A SIZE OF DATA REQUIRED FOR RECORDING A PHYSICAL CHARACTERISTIC OF AN OPTICAL DEVICE

(71) Applicant: Hung-Cheng Kuo, Hsinchu (TW)

(72) Inventor: Hung-Cheng Kuo, Hsinchu (TW)

( * ) Notice: Subject to any disclaimer, the term of this patent is extended or adjusted under 35 U.S.C. 154(b) by 0 days.

(21) Appl. No.: 16/936,093

(22) Filed: Jul. 22, 2020

(51) Int. Cl.
   *G09G 5/02* (2006.01)
   *H03M 7/40* (2006.01)

(52) U.S. Cl.
   CPC ............... *G09G 5/02* (2013.01); *H03M 7/40* (2013.01); *G09G 2320/029* (2013.01); *G09G 2320/0233* (2013.01); *G09G 2320/0242* (2013.01); *G09G 2330/12* (2013.01)

(58) Field of Classification Search
   CPC ............. G09G 5/02; G09G 2320/0233; G09G 2320/029; G09G 2330/12; G09G 2320/0242; H03M 7/40
   See application file for complete search history.

(56) References Cited

U.S. PATENT DOCUMENTS

| 6,124,811 | A  | * | 9/2000  | Acharya | H04N 19/61 |
|           |    |   |         |         | 341/63     |
| 2011/0141134 | A1 | * | 6/2011  | Sasaki  | H04N 1/642 |
|           |    |   |         |         | 345/600    |
| 2014/0375665 | A1 | * | 12/2014 | Surti   | G06T 11/40 |
|           |    |   |         |         | 345/555    |

* cited by examiner

*Primary Examiner* — Sahlu Okebato
(74) *Attorney, Agent, or Firm* — Hamre, Schumann, Mueller & Larson, P.C.

(57) ABSTRACT

A method for reducing a size of data required for recording a physical characteristic of an optical device is proposed. By performing variable-length coding on sub-pixel data pieces that respectively represent physical characteristics of multiple sub-pixels of the optical device based on a similarity in spatial trend of the physical characteristics of the sub-pixels, a plurality of pixel-index data pieces are generated, and a part of the sub-pixel data pieces can thus be removed to obtain reduced sub-pixel data pieces. The pixel-index data pieces and the reduced sub-pixel data pieces cooperatively replace the sub-pixel data pieces to serve as an index for finding the physical characteristics of the sub-pixels.

5 Claims, 5 Drawing Sheets

METHOD FOR REDUCING A SIZE OF DATA REQUIRED FOR RECORDING A PHYSICAL CHARACTERISTIC OF AN OPTICAL DEVICE

FIELD

The disclosure relates to data encoding, and more particularly to a data encoding method for reducing a size of data required for recording a physical characteristic of an optical device.

BACKGROUND

To deal with the issue of non-uniform color presentation of the sub-pixels on a display panel (e.g., LCD panel, OLED panel, MicroLED panel, etc.), which is also called "mura" in the industry, a common approach is to record these conditions and then rely on some algorithms to calculate, for each sub-pixel, an output grayscale based on an input grayscale, a desired luminance corresponding to the input grayscale, and a relationship between grayscale and luminance (referring to as a grayscale-luminance relationship hereinafter) measured for the sub-pixel. These algorithms allow panels with some flaws to behave as normal panels that provide desired color rendering, thereby achieving better yields. Such approach is also called "demura" in the industry, and can be referenced to FIG. 3 and relevant passages in U.S. patent Ser. No. 10/580,385.

In order to perform demura operation, memory components (e.g., SRAM) are required to record the characteristics of the panel (e.g., the grayscale-luminance relationship for each sub-pixel). However, as the display panel becomes larger, or to follow the market trend, space available for driver ICs on the display panel becomes relatively small. As a result, the internal SRAM of the driver ICs should not be too large, which may make the driver ICs too tall to fit under limited height, or too large to fit production cost control.

Therefore, not only good algorithm, but also good data compression is required to perform demura operation with limited memory capacity.

SUMMARY

Therefore, an object of the disclosure is to provide a method for reducing a size of data required for recording a physical characteristic of an optical device (e.g., grayscale-luminance relationships of sub-pixels of a display device), wherein the optical device includes a plurality of pixels each composed of multiple sub-pixels respectively of multiple sub-pixel colors.

According to the disclosure, the method is implemented by a processor, and includes: A) receiving multiple color-related data pieces, wherein each of the color-related data pieces corresponds to a respective one of the sub-pixel colors, and includes multiple sub-pixel data pieces each representing a physical characteristic of a respective one of the sub-pixels of the sub-pixel color; B) generating a plurality of pixel-index data pieces that respectively correspond to the pixels by treating, for each of the pixels, the sub-pixel data pieces that respectively correspond to the sub-pixels of the pixel as a pixel data piece, and performing variable-length coding based on the pixel data pieces that correspond to the pixels; and C) obtaining reduced sub-pixel data pieces by removing a part of the sub-pixel data pieces from the color-related data pieces based on the pixel-index data pieces. The pixel-index data pieces and the reduced sub-pixel data pieces cooperatively replace the sub-pixel data pieces to serve as an index for finding the physical characteristics of the sub-pixels.

BRIEF DESCRIPTION OF THE DRAWINGS

Other features and advantages of the disclosure will become apparent in the following detailed description of the embodiment (s) with reference to the accompanying drawings, of which.

DETAILED DESCRIPTION

Figure 1:
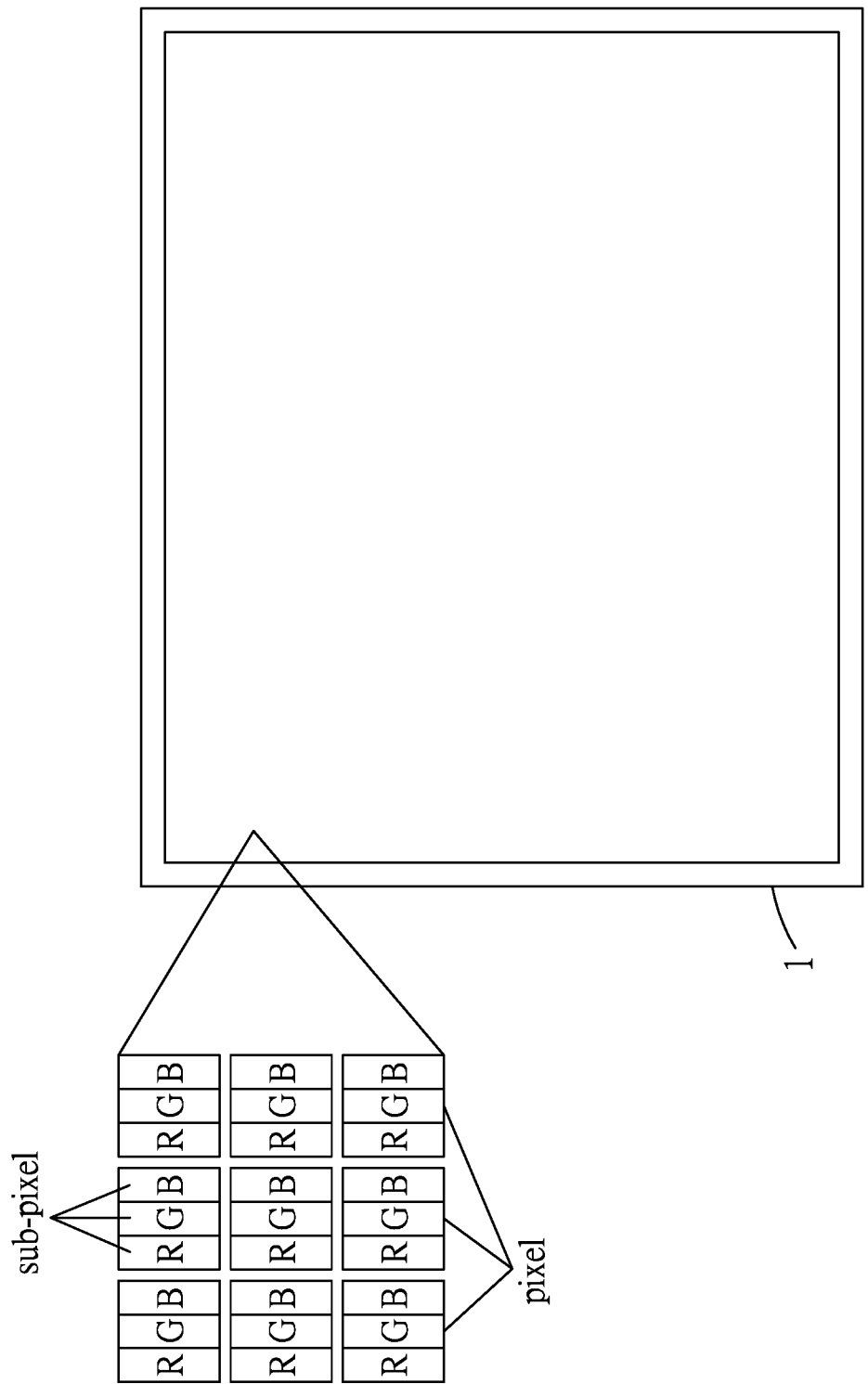
FIG. 1 is a schematic diagram illustrating a display panel.

Before the disclosure is described in greater detail, it should be noted that where considered appropriate, reference numerals or terminal portions of reference numerals have been repeated among the figures to indicate corresponding or analogous elements, which may optionally have similar characteristics.

Referring to FIG. 1, a display panel 1 is shown to include a plurality of pixels, each composed of multiple sub-pixels respectively of multiple sub-pixel colors. In this embodiment, each of the pixels is composed of three sub-pixels respectively of red (R), green (G), and blue (B) colors. In other embodiments, a pixel may be composed of four or more sub-pixels of different sub-pixel colors, such as red, green, blue, and white colors, red, green, blue, and yellow colors, etc., and this disclosure is not limited in this respect.

In order to mitigate the non-uniform color presentation of the sub-pixels on a display pane manufacturers may use an automated optical inspection (AOI) instrument (not shown) to measure, for each of the sub-pixel colors, luminance of each of the sub-pixels of the sub-pixel color at several different grayscales. For example, luminance of the sub-pixels of the red color may be measured when the display panel is controlled to present a full screen of the red color at a first given grayscale, a second given grayscale, a third given grayscale, and so on, thereby obtaining a plurality of measured luminance values for the sub-pixels of the red color. Then, for each of the sub-pixels of the red color, differences between the measured luminance values and desired measured luminance values are calculated for the given grayscales, so as to obtain a color-related difference data piece for the sub-pixels of the red color. As a result, several color-related difference data pieces that respectively correspond to the different sub-pixel colors are obtained. These color-related difference data pieces may serve as a reference for demura operation that is to compensate for differences between a desired grayscale-luminance relationship and actual grayscale-luminance relationships of the sub-pixels. In order to reduce memory capacity required for storing the color-related difference data pieces, quantization and data compression may be performed on the color-related difference data pieces.

In some implementations, manufacturers may use the measured luminance values to estimate a grayscale-luminance relationship for each sub-pixel by, for example, curve fitting techniques, one of which may be referenced to U.S. patent Ser. No. 10/580,385, and details thereof are omitted herein for the sake of brevity. In the implementation as described in U.S. patent Ser. No. 10/580,385, for each of the sub-pixel colors, over one thousand fitting curves may be used to fit the grayscale-luminance relationships for the sub-pixels of the sub-pixel color, and each sub-pixel corresponds to one of the fitting curves. In order to reduce memory capacity required for recording the correspondences between the sub-pixels and the fitting curves during the demura operation, lossless coding, which is usually variable-length coding (e.g., the Huffman coding), may be used to compress data for recording the correspondences.

This disclosure proposes a method to further reduce the memory capacity required for recording the color-related difference data pieces or the correspondences between the sub-pixels and the fitting curves. The proposed method can be performed on either the raw data (i.e., the original measured luminance values or the correspondences between the sub-pixels and the fitting curves, which have not been compressed yet) or the compressed data (i.e., the measured luminance values or the correspondences between the sub-pixels and the fitting curves after data compression). Data processing in the proposed method is based on the principle that physical characteristics of the sub-pixels of different sub-pixel colors will have similar spatial trends. For example, for the sub-pixels of the red color, if the grayscale-luminance relationships of the sub-pixels in one region (e.g., around the central portion of the panel) meet or are close to the desired grayscale-luminance relationship, while the grayscale-luminance relationships of the sub-pixels in another region (e.g., near an edge of the panel) have relatively large deviations from the desired grayscale-luminance relationship, similar trends are usually found in the sub-pixels of other sub-pixel colors. This is because the display panel is produced as an entirety, and the sub-pixels of different sub-pixel colors are not produced separately or independently. As a result, nearby pixels (e.g., multiple pixels in a specific region of the display panel) are likely to exhibit the same or similar characteristics in terms of the grayscale-luminance relationships of their sub-pixels. Such property can be employed to perform further data encoding by treating a pixel that is composed of multiple sub-pixels as a unit to be encoded. Besides display panels, image sensors also have such property, so the proposed method is also suitable for recording physical characteristics of sub-pixels of an image sensor. However, for an ordinary color image, data for different colors are independent from each other, so the method proposed in this disclosure may not effectively reduce the data size for an ordinary color image.

Embodiments of the proposed method according to this disclosure are used to reduce a size of data required for recording a physical characteristic of an optical device. The optical device includes a plurality of pixels each composed of multiple sub-pixels respectively of multiple sub-pixel colors (e.g., red, green and blue colors in this embodiment). In other words, for an optical device that includes N pixels, there are N sub-pixels for each of the sub-pixel colors. The physical characteristic may refer to, for example, the grayscale-luminance relationship for each sub-pixel, but this disclosure is not limited in this respect. The optical device may be, for example, a display panel that emits light whose luminance is determined based on grayscales received from a signal source, or an image sensor that converts luminance of light received thereby into grayscales. The embodiments of this disclosure exemplify the optical device as a display panel (e.g., the display panel 1 in FIG. 1), and are implemented by a processor of a computer device that is configured to perform statistical analysis and variable-length coding (e.g., the Huffman coding) by hardware, firmware, software or a combination thereof.

Figure 2:
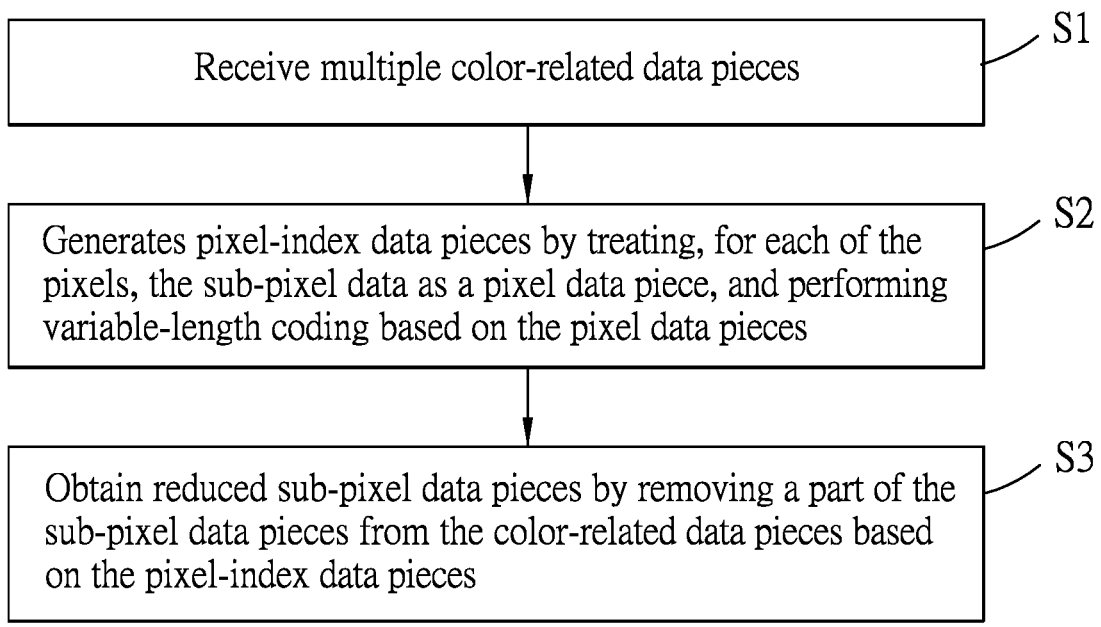
FIG. 2 is a flow chart illustrating steps of embodiments of a method for reducing a size of data required for recording a physical characteristic of an optical device according to this disclosure.
Figure 3:
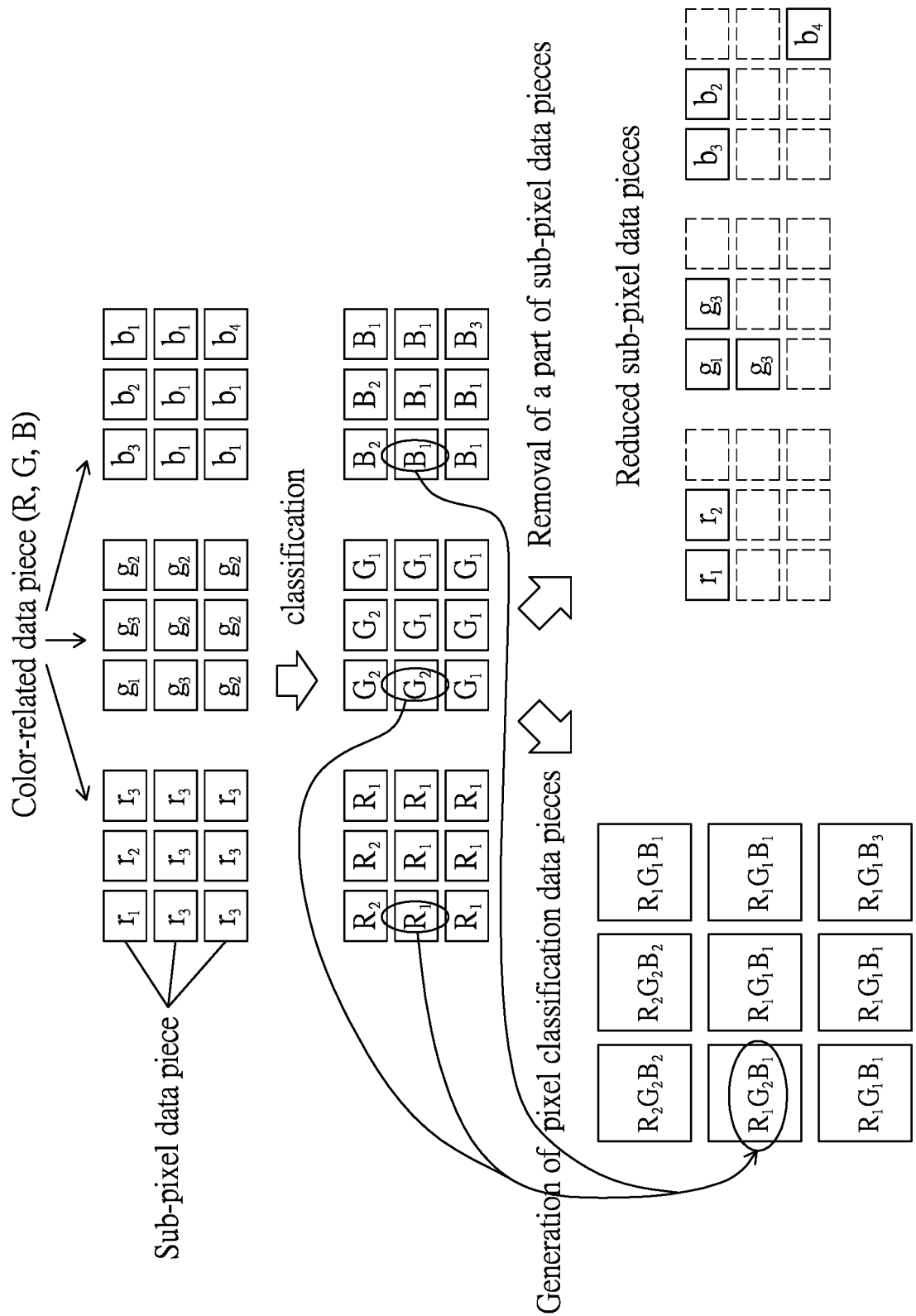
FIG. 3 is a schematic diagram exemplarily illustrating an operation of a first one of the embodiments.

FIG. 2 is a flow chart illustrating a first embodiment of the proposed method according to this disclosure, and FIG. 3 is a schematic diagram illustrating the first embodiment.

In step S1, the processor receives multiple color-related data pieces. Each of the color-related data pieces corresponds to a respective one of the sub-pixel colors, and includes multiple sub-pixel data pieces each representing a physical characteristic (e.g., a grayscale-luminance relationship) of a respective one of the sub-pixels of the sub-pixel color. In FIG. 3, a display panel that includes only 3×3=9 pixels is used as an example for illustrative purposes, so each of the color-related data pieces includes nine sub-pixel data pieces. In this embodiment, the color-related data pieces may be the color-related difference data pieces (before or after data compression) or the correspondences between the sub-pixels and the fitting curves (before or after data compression) as described in the previous paragraphs. In this embodiment, the correspondences between the sub-pixels and the fitting curves are exemplified as the color-related data pieces. As mentioned above, for each of the sub-pixel colors, more than one thousand fitting curves may be used to fit the sub-pixels of the sub-pixel color. In one implementation, these fitting curves may be numbered, and each of the sub-pixel data pieces may indicate a number that corresponds to one of the fitting curves for the respective one of the sub-pixels.

Figure 4:
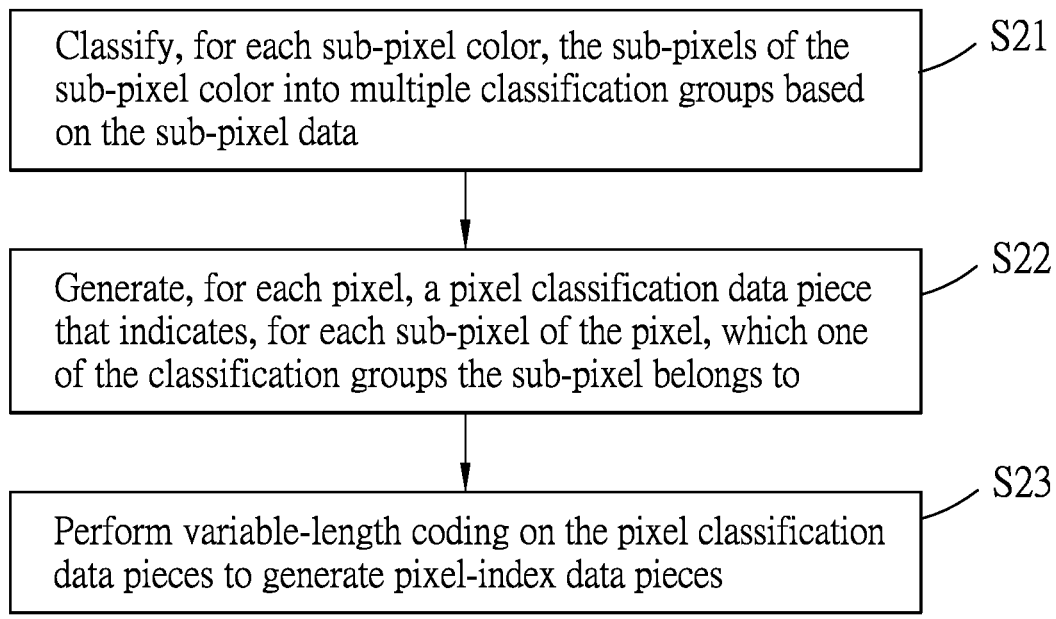
FIG. 4 is a flow chart illustrating details of step S2 of the first one of the embodiments.

In step S2, the processor generates a plurality of pixel-index data pieces that respectively correspond to the pixels by treating, for each of the pixels, the sub-pixel data pieces that respectively correspond to the sub-pixels of the pixel as a pixel data piece, and performing variable-length coding based on the pixel data pieces that correspond to the pixels. In this embodiment, step S2 includes sub-steps S21-S23, as shown in FIG. 4.

In sub-step S21, the processor classifies, for each of the sub-pixel colors, the sub-pixels of the sub-pixel color into multiple classification groups based on the sub-pixel data pieces that correspond to the sub-pixels of the sub-pixel color. In this embodiment, the sub-pixel data pieces may be sorted based on the frequency (or rate) of occurrence of each possible value of the sub-pixel data pieces.

In an example of classification, the sub-pixels of the sub-pixel color may be classified into multiple classification groups based on the following rules: 1) the first classification group includes the sub-pixels that correspond to the sub-pixel data pieces whose values are the top two in terms of the frequency of occurrence among all the sub-pixel data pieces for the sub-pixel color; 2) the second classification group cooperates with the first classification group to include at least a first predetermined percentage (e.g., 80%) of the sub-pixels, the third classification group cooperates with the first and second classification groups to include at least a second predetermined percentage (e.g., 95%) of the sub-pixels, and so on; and 3) the sub-pixels in the $n^{th}$ classification group correspond to the sub-pixel data pieces whose values have a frequency of occurrence greater than that of the sub-pixel data pieces that correspond to the sub-pixels in the $(n+1)^{th}$ classification group. It is noted that the rules for classification can be defined as desired by a user, and are not limited to those described in this disclosure. Furthermore, the rules for classification may be different for sub-pixels of different sub-pixel colors. Table 1 exemplarily shows part of a result of sorting of the sub-pixel data pieces that correspond to the sub-pixels of a specific sub-pixel color, sorted based on the frequency of occurrence of the same value, with the resultant ranks arranged from high to low in terms of the frequency of occurrence. The data shown in Table 1 is measured from an actual display panel. It is noted that Table 1 only shows the sub-pixel data pieces whose values are the top twenty-four in terms of frequency of occurrence for the sake of brevity because there are more than one thousand possible values for the sub-pixel data pieces in total.

TABLE 1

(unit: %)

| Rank 1 to Rank 6 | | | | | |
|---|---|---|---|---|---|
| 46.0783 | 6.4785 | 4.6252 | 4.1483 | 3.6027 | 3.5256 |
| Rank 7 to Rank 12 | | | | | |
| 2.6941 | 2.3142 | 1.9327 | 1.6779 | 1.5333 | 1.3246 |
| Rank 13 to Rank 18 | | | | | |
| 1.2558 | 1.2331 | 1.0411 | 0.9576 | 0.9103 | 0.8652 |
| Rank 19 to Rank 24 | | | | | |
| 0.7769 | 0.7507 | 0.6893 | 0.6211 | 0.5866 | 0.5581 |

Table 1 illustrates that, for the specific sub-pixel color, 46.0783% of the sub-pixels correspond to a first fitting curve (Rank 1), 6.4785% of the sub-pixels correspond to a second fitting curve (Rank 2), 4.6252% of the sub-pixels correspond to a third fitting curve (Rank 3), and so on. If all the sub-pixels of the specific sub-pixel color are classified into three classification groups according to the rules introduced in the first example, the classification result would be that 52.5568% (Rank 1 and Rank 2) of the sub-pixels belong to the first classification group, 28.6344% (Rank 3 to Rank 13) of the sub-pixels belong to the second classification group, and the remaining 18.8088% of the sub-pixels belong to the third classification group.

In this embodiment, the sub-pixels with the highest frequency of occurrence in terms of the value of the sub-pixel data pieces are classified into a first classification group. For a display panel produced with good quality, the first classification group may include more than 90% of the sub-pixels of the corresponding sub-pixel color (i.e., more than 90% of the sub-pixel data pieces have the same value, which represents that more than 90% of the sub-pixels correspond to the same fitting curve in this embodiment). For different sub-pixel colors, a total number of the classification groups may either be the same or different. In one exemplary implementation, for each of the sub-pixel colors, the sub-pixels of the sub-pixel color are classified into two groups only, namely a first classification group and a second classification group. The first classification group includes those of the sub-pixels that have the highest frequency of occurrence among all of the sub-pixels of the sub-pixel color in terms of the value of the corresponding sub-pixel data piece, and the second classification group includes remaining ones of the sub-pixels of the sub-pixel color. In a case that the display panel is produced using a good and mature manufacturing process, those of the sub-pixels that have a highest frequency of occurrence in terms of the value of the sub-pixel data piece would have the desired grayscale-luminance relationship, and thus no compensation adjustment is required for the sub-pixels in the first classification group.

FIG. 3 exemplifies that, for the red color, the sub-pixel data pieces with the value of "$r_3$" have the highest frequency of occurrence, so the corresponding sub-pixels are classified into the first classification group "$R_1$" for the red color; for the green color, the sub-pixel data pieces with the value of "$g_2$" have the highest frequency of occurrence, so the corresponding sub-pixels are classified into the first classification group "$G_1$" for the green color; and for the blue color, the sub-pixel data pieces with the value of "$b_1$" have the highest frequency of occurrence, so the corresponding sub-pixels are classified into the first classification group "$B_1$" for the blue color. It is noted that, in FIG. 3, the sub-pixels of the red color and the sub-pixels of the green color are classified into two classification groups, and the sub-pixels of the blue color are classified into three classification groups, but this disclosure is not limited to such.

In sub-step S22, the processor generates, for each of the pixels, a pixel classification data piece that indicates, for each of the sub-pixels thereof, which one of the classification groups the sub-pixel belongs to. In the exemplary implementation, for each of the pixels, the pixel classification data piece indicates, for each of the sub-pixels thereof, which one of the first and second classification groups the sub-pixel belongs to. As an example, for a pixel of which the red sub-pixel belongs to the first classification group for the red color, the green sub-pixel belongs to the second classification group for the green color, and the blue sub-pixel belongs to the first classification group for the blue color, the corresponding pixel classification data piece may indicate such a combination of the classification groups for the red, green and blue sub-pixels. As exemplified in FIG. 3, the pixel classification data piece that corresponds to the leftmost pixel at the second row indicates that the sub-pixel data pieces corresponding to the sub-pixels thereof belong to the classification groups "$R_1$", "$G_2$", and "$B_1$", respectively.

In sub-step S23, the processor performs variable-length coding on the pixel classification data pieces generated for the pixels to generate the pixel-index data pieces in order to reduce the data size. The variable-length coding is usually a lossless coding technique (e.g., the Huffman coding) that is performed based on a probability or frequency of occurrence for each possible data value. In variable-length coding, the data value with higher probability or frequency of occurrence would be encoded using less bits. For a display panel produced with good quality, a great number of the pixel classification data pieces would be the same, so the data size of the pixel classification data pieces can be significantly reduced by performing variable-length coding thereon.

In step S3, the processor obtains reduced sub-pixel data pieces by removing a part of the sub-pixel data pieces from the color-related data pieces based on the pixel-index data pieces. The part of the sub-pixel data pieces to be removed correspond to those of the sub-pixels in one of the classification groups (usually being the first classification group because the first classification group usually includes most of the sub-pixels, but this disclosure is not limited to such) generated for each of the sub-pixel colors. For a display panel produced with good quality, removing the part of the sub-pixel data pieces would significantly reduce the data size (i.e., a combined data size of the reduced sub-pixel data pieces would be much smaller than that of the sub-pixel data pieces originally included in the color-related data pieces) in the exemplary implementation because more than 90% of the sub-pixels belong to the first classification group obtained for the corresponding sub-pixel colors, which means that more than 90% of the color-related data pieces would be removed. As exemplified in FIG. 3, the sub-pixel data pieces that correspond to those of the sub-pixels classified into the classification groups "$R_1$", "$G_1$" and "$B_1$" are removed, with the remainder of the sub-pixel data pieces of the color-related data pieces serving as the reduced sub-pixel data pieces. The pixel-index data pieces and the reduced sub-pixel data pieces cooperatively replace the color-related data pieces to serve as an index for finding the physical characteristics of the sub-pixels. Although some memory capacity would be required to store the pixel-index data pieces, a size thereof would be smaller than that required for storing the removed part of the sub-pixel data pieces because a number of combinations of the classification groups for the sub-pixels (e.g., eight combinations in total when there are two classification groups for each of the R, G, B colors) is much smaller than a number of possible values of the sub-pixel data pieces (more than one thousand fitting curves), so the data structure would be much simpler. Therefore, a combined size of the pixel-index data pieces and the size of the reduced sub-pixel data pieces would be smaller than a combined size of the original color-related data pieces, and memory capacity required for recording the grayscale-luminance relationships of the sub-pixels is thus reduced. Then, the processor transmits the pixel-index data pieces and the reduced sub-pixel data pieces to an arithmetic circuit that performs demura operation for the display panel. The arithmetic circuit may be disposed on the display panel or a system that cooperates with the display panel to form an electronic device (e.g., a smartphone, a notebook computer, a tablet computer, etc.).

It is noted that, the embodiments of this disclosure are not limited to being used in a display panel where, for each sub-pixel color, more than 90% of the sub-pixels correspond to the same fitting curve. However, the reduction in data size would be more prominent when the display panel has good uniformity in terms of grayscale-luminance relationship. In one experiment, for a display panel of which the pixels are composed of sub-pixels of three sub-pixel colors, the pixel-index data pieces have a data size of 1.3 bits for one pixel in average, while the original sub-pixel data pieces theoretically require at least three bits for a single pixel (i.e., at least one bit for each sub-pixel). If 90% of the sub-pixels correspond to the same fitting curve for each sub-pixels color, 90% of the sub-pixel data pieces can be removed in step S3 of the embodiment, and thus at least 2.7 bits (3 bits 90%) can be released for one pixel on average. As a result, the data size can be reduced by at least 1.4 bits (2.7 bits-1.3 bits) for one pixel on average, so the memory capacity required for recording the grayscale-luminance relationships of the sub-pixels can be reduced.

In one application, the memory capacity saved or earned by the embodiment of the proposed method can be used to simplify the circuit design (e.g., to compensate for the greater memory capacity needed for a simpler circuit design). It is noted that data structure of the sub-pixel data pieces in the color-related data pieces may be of high complexity because the encoding may take all possible values of the sub-pixel data pieces into consideration. After the sub-pixels are classified into several classification groups in sub-step S21, each classification group corresponds to only a part of the possible values of the sub-pixel data pieces, so there is a chance to simplify the data structure of the sub-pixel data pieces by re-encoding, for each of the classification groups, the sub-pixel data pieces that correspond to those of the sub-pixels in the classification group. However, the sub-pixel data pieces that are to be removed in step S3 and that correspond to those of the sub-pixels in said one of the classification groups do not need to be re-encoded. Accordingly, after sub-step S21, the processor may independently encode, for each of the classification groups other than said one of the classification groups, the sub-pixel data pieces that correspond to those of the sub-pixels in such classification group, in order to simplify the data structure of the sub-pixel pieces, which may facilitate design of decoding circuits. The re-encoding may be performed using either variable-length coding or fixed-length coding.

In a scenario where the sub-pixel data pieces are encoded using variable-length coding, in order to find corresponding sub-pixel data pieces for a pixel, a decoding circuit may use a first decoder to decode, for each of the pixels, the pixel-index data piece to know, for each of the sub-pixels of the pixel, which classification group the sub-pixel belongs to. Then, a second decoder may be required to find the code lengths of the corresponding sub-pixel data pieces. Only when the code lengths of the sub-pixel data pieces are known can the circuit correctly retrieve the sub-pixel data pieces from a memory component. The additional second decoder may increase the complexity of the decoding circuit.

Fixed-length coding can make design of the decoding circuit even simpler. As an example, for a classification group that corresponds to sixteen possible values of the sub-pixel data pieces (i.e., corresponding to sixteen fitting curves in this embodiment), each possible value can be represented using a unique four-bit combination (e.g., one of 4'b0000 to 4'b1111) when fixed-length coding is applied. Although fixed-length coding may result in a greater data size in comparison to variable-length coding, the memory capacity earned by the embodiment of the proposed method can be used to compensate for the additional memory capacity required by fixed-length coding. In a scenario where the sub-pixel data pieces are encoded using fixed-length coding, in order to find corresponding sub-pixel data pieces for a pixel, the decoding circuit may use a decoder to decode, for each of the pixels, the pixel-index data piece to know, for each of the sub-pixels of the pixel, which classification group the sub-pixel belongs to. Then, a code length of the sub-pixel data piece that corresponds to the sub-pixel is known because each classification group corresponds to a fixed code length, and it is simple for the decoding circuit to retrieve the sub-pixel data pieces from a memory component.

In this embodiment, for each of the sub-pixel colors, the sub-pixels in the first classification group correspond to only one fitting curve with the highest frequency of occurrence, a demura circuit that performs demura operation for the display panel can know which fitting curve to which those sub-pixels correspond from the corresponding pixel-index data pieces, which are obtained by encoding the pixel classification data pieces each of which indicates, for each of the sub-pixels of the corresponding pixel, which one of the classification groups the sub-pixel belongs to. Therefore, even if the sub-pixel data pieces that correspond to those sub-pixels in the first classification group have been removed, the demura circuit can still correctly perform demura operation.

Figure 5:
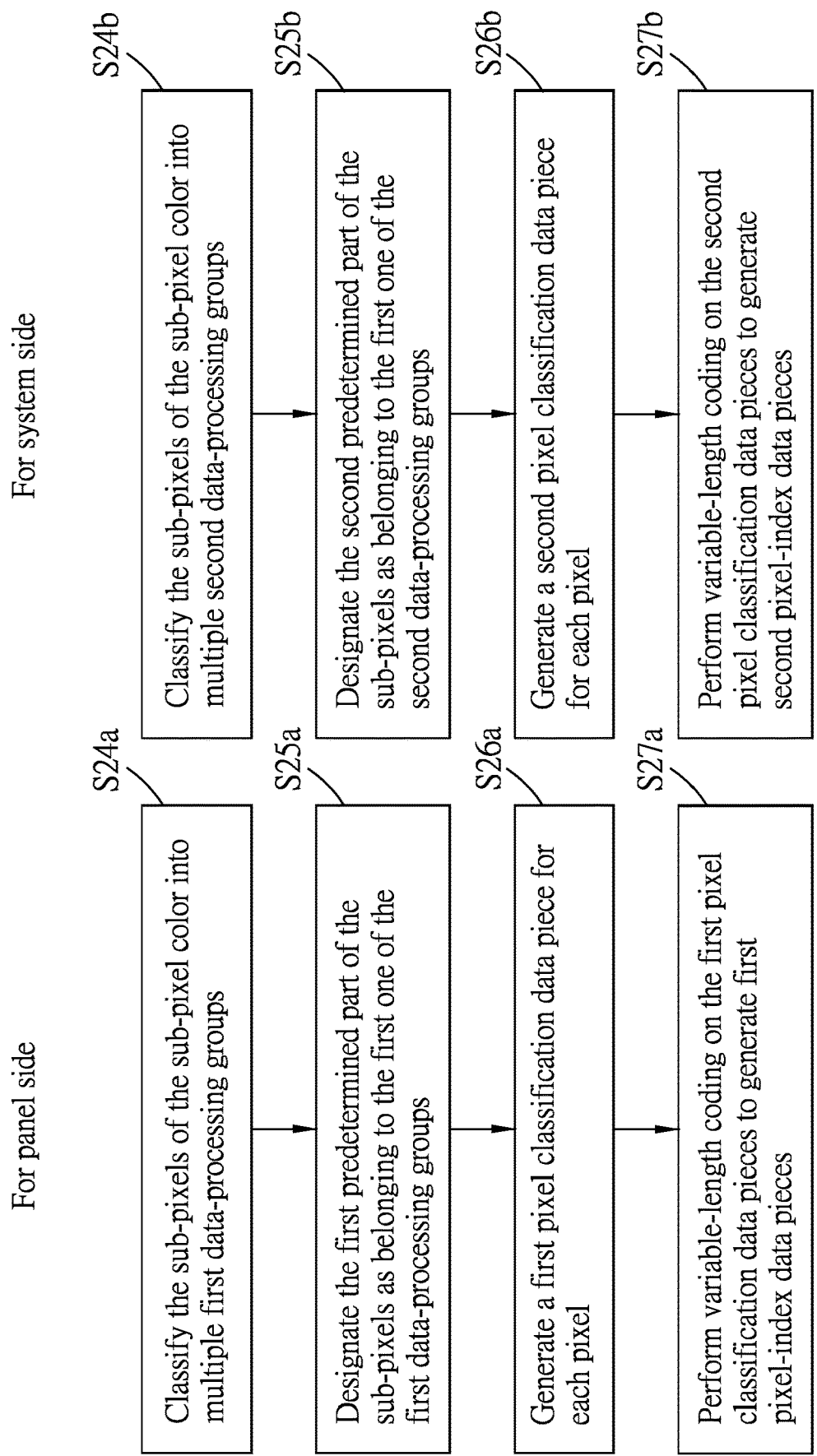
FIG. 5 is a flow chart illustrating details of step S2 of a second one of the embodiments.

Referring to FIGS. 2 and 5, a second embodiment of the proposed method according to this disclosure is different from the first embodiment in the details of step S2. In practice, the demura operation for the display panel may be cooperatively performed by an arithmetic circuit of the display panel and an arithmetic circuit (e.g., a processor) of a system that cooperates with the display panel to form an electronic device (e.g., a smartphone, a notebook computer, a table computer, etc.). The arithmetic circuit in the system is usually more powerful than that at the panel side in terms of computational capability, and therefore can be used to perform demura operation on a part of the sub-pixels of the display panel, thereby reducing the computational load for the arithmetic circuit at the panel side. The second embodiment is applicable to such a scenario where the arithmetic circuit at the system side and the arithmetic circuit at the panel side cooperate to perform demura operation. In such scenario, the user may arbitrarily divide, for each of the sub-pixel colors, the sub-pixels of the sub-pixel color into a first predetermined part to be processed by one of the arithmetic circuit at the system side and the arithmetic circuit at the panel side, and a second predetermined part to be processed by the other one of the arithmetic circuit at the system side and the arithmetic circuit at the panel side. Divisions of the sub-pixels of different sub-pixel colors may be different, as long as the first and second predetermined parts of the sub-pixels of a sub-pixel color form an entirety of the sub-pixels of the sub-pixel color. This embodiment exemplifies that the first and second predetermined parts are to be processed respectively by the arithmetic circuit at the system side and the arithmetic circuit at the panel side. In such a case, the system side may include a memory component (e.g., SRAM) to store the pixel-index data pieces and a part of the sub-pixel data pieces that corresponds to the first predetermined part of the sub-pixels for performing demura operation. Similarly, the panel side may include a memory component (e.g., SRAM) to store the pixel-index data pieces and a part of the sub-pixel data pieces that corresponds to the second predetermined part of the sub-pixels for performing demura operation. In the second embodiment, step S2 includes sub-steps S24a-S27a and S24b-S27b, where the processor generates a first index data set for use by the panel side during the demure operation in sub-steps S24a-S27a, and generates a second index data set for use by the system side during the demura operation in sub-steps S24b-S27b.

In sub-step S24a, the processor classifies, for each of the sub-pixel colors, the sub-pixels of the sub-pixel color into multiple first data-processing groups based on the sub-pixel data pieces that correspond to the sub-pixels of the sub-pixel color. The first one of the first data-processing groups includes those of the sub-pixels that have a highest frequency of occurrence in terms of the value of the corresponding sub-pixel data piece among all of the sub-pixels of the sub-pixel color. In sub-step S24b, the processor classifies, for each of the sub-pixel colors, the sub-pixels of the sub-pixel color into multiple second data-processing groups based on the sub-pixel data pieces that correspond to the sub-pixels of the sub-pixel color. The first one of the second data-processing groups includes those of the sub-pixels that have a highest frequency of occurrence in terms of the value of the corresponding sub-pixel data piece among all of the sub-pixels of the sub-pixel color. The first one of the first data-processing groups obtained in sub-step S24a and the first one of the second data-processing groups obtained in sub-step S24b may be the same. Sub-steps S24a and S24b are similar to sub-step S21 in the first embodiment.

In sub-step S25a, the processor designates, for each of the sub-pixel colors, the first predetermined part of the sub-pixels of the sub-pixel color as belonging to the first one of the first data-processing groups. The sub-pixel data pieces that correspond to those sub-pixels in the first one of the first data-processing groups are to be removed from the color-related data pieces in step S3, so as to obtain a first reduced characteristic data set for use by the arithmetic circuit at the panel side to perform demura operation on the second predetermined part of the sub-pixels. In sub-step S25b, the processor designates, for each of the sub-pixel colors, the second predetermined part of the sub-pixels of the sub-pixel color as belonging to the first one of the second data-processing groups. The sub-pixel data pieces that correspond to those sub-pixels in the first one of the second data-processing groups are to be removed from the color-related data pieces in step S3, so as to obtain a second reduced characteristic data set for use by the arithmetic circuit at the system side to perform demura operation on the first predetermined part of the sub-pixels.

In sub-step S26a, the processor generates, for each of the pixels, a first pixel classification data piece that indicates, for each of the sub-pixels of the pixel, which one of the first data-processing groups the sub-pixel belongs to. In sub-step S26b, the processor generates, for each of the pixels, a second pixel classification data piece that indicates, for each of the sub-pixels of the pixel, which one of the second data-processing groups the sub-pixel belongs to Sub-steps S26a and S26b are similar to sub-step S22 in the first embodiment.

In sub-step S27a, the processor performs variable-length coding on the first pixel classification data pieces generated for the pixels, so as to generate first pixel-index data pieces that serve as the first index data set. In sub-step S27b, the processor performs variable-length coding on the second pixel classification data pieces generated for the pixels, so as to generate second pixel-index data pieces that serve as the second index data set. Sub-steps S27a and S27b are similar to sub-step S23 in the first embodiment.

In step S3, the processor obtains a first reduced characteristic data set for use by the arithmetic circuit at the panel side to perform demura operation on the second predetermined part of the sub-pixels, by removing, from the color-related data pieces, a part of the sub-pixel data pieces that correspond to those of the sub-pixels in the first one of the first data-processing groups generated for each of the sub-pixel colors. The processor further obtains a second reduced characteristic data set for use by the arithmetic circuit at the system side to perform demura operation on the first predetermined part of the sub-pixels, by removing, from the color-related data pieces, a part of the sub-pixel data pieces that correspond to those of the sub-pixels in the first one of the second data-processing groups generated for each of the sub-pixel colors.

Then, the processor transmits, for each of the sub-pixel colors, the first index data set and the first reduced characteristic data set to the arithmetic circuit at the panel side, which performs data processing (e.g., demura operation) on a part of an image (corresponding to the second predetermined part of the sub-pixels of the sub-pixel color) for the sub-pixel color based on the first index data set and the first reduced characteristic data set. The processor also transmits, for each of the sub-pixel colors, the second index data set and the second reduced characteristic data set to the arithmetic circuit at the system side, which performs data processing (e.g., demura operation) on the other part of an image (corresponding to the first predetermined part of the sub-pixels of the sub-pixel color) for the sub-pixel color based on the second index data set and the second reduced characteristic data set. Since the arithmetic circuit at the panel side does not perform demure operation on the first predetermined part of the sub-pixels, memory capacity required for recording the grayscale-luminance relationships of the sub-pixels can be further reduced at the panel side.

In summary, the embodiments of the proposed method according to this disclosure generate pixel-index data pieces by performing variable-length coding based on the similarity in spatial trend of the physical characteristics of the sub-pixels of different sub-pixel colors, a great number of the sub-pixel data pieces of the color-related data pieces can be removed, thereby reducing the size of data required for recording the physical characteristic of the optical device.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what is (are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A method for reducing a size of data required for recording a physical characteristic of an optical device, the optical device including a plurality of pixels each composed of multiple sub-pixels respectively of multiple sub-pixel colors, said method being implemented by a processor, and comprising:
   A) receiving multiple color-related data pieces, wherein each of the color-related data pieces corresponds to a respective one of the sub-pixel colors and includes multiple sub-pixel data pieces each representing a physical characteristic of a respective one of the sub-pixels of the sub-pixel color;
   B) generating a plurality of pixel-index data pieces that respectively correspond to the pixels by treating, for each of the pixels, the sub-pixel data pieces that respectively correspond to the sub-pixels of the pixel as a pixel data piece, and performing variable-length coding based on the pixel data pieces that correspond to the pixels; and
   C) obtaining reduced sub-pixel data pieces by removing a part of the sub-pixel data pieces from the color-related data pieces based on the pixel-index data pieces;
   wherein the pixel-index data pieces and the reduced sub-pixel data pieces cooperatively replace the sub-pixel data pieces to serve as an index for finding the physical characteristics of the sub-pixels;
   wherein step B) includes:
   classifying, for each of the sub-pixel colors, the sub-pixels of the sub-pixel color into multiple classification groups based on the sub-pixel data pieces that correspond to the sub-pixels of the sub-pixel color;
   generating, for each of the pixels, a pixel classification data piece that indicates, for each of the sub-pixels of the pixel, which one of the classification groups the sub-pixel belongs to; and
   performing the variable-length coding on the pixel classification data pieces generated for the pixels, so as to generate the pixel-index data pieces; and
   wherein, in step C), the part of the sub-pixel data pieces corresponds to, for each of the sub-pixel colors, those of the sub-pixels in one of the classification groups generated for the sub-pixel color.

2. The method of claim 1, wherein, for one of the sub-pixel colors, the classification groups include a first classification group and a second classification group;
   wherein the first classification group includes those of the sub-pixels that have a highest frequency of occurrence among all of the sub-pixels of the sub-pixel color in terms of a value of the sub-pixel data pieces and the second classification group includes remaining ones of the sub-pixels of the sub-pixel color;
   wherein, in step B), for each of the pixels, the pixel classification data piece indicates, for each of the sub-pixels of the pixel, which one of the first and second classification groups the sub-pixel belongs to; and
   wherein, in step C), the part of the sub-pixel data pieces corresponds to those of the sub-pixels in the first classification group generated for the sub-pixel colors.

3. The method of claim 1, further comprising:
   D) for each of the sub-pixel colors, independently encoding, for each of the classification groups other than said one of the classification groups, the sub-pixel data pieces that correspond to those of the sub-pixels in the classification group.

4. The method of claim 3, wherein the encoding in step D) is fixed-length coding.

5. A method for reducing a size of data required for recording a physical characteristic of an optical device, the optical device including a plurality of pixels each composed of multiple sub-pixels respectively of multiple sub-pixel colors, said method being implemented by a processor, and comprising:
   A) receiving multiple color-related data pieces, wherein each of the color-related data pieces corresponds to a respective one of the sub-pixel colors and includes multiple sub-pixel data pieces each representing a physical characteristic of a respective one of the sub-pixels of the sub-pixel color;
   B) generating a plurality of pixel-index data pieces that respectively correspond to the pixels by treating, for each of the pixels, the sub-pixel data pieces that respectively correspond to the sub-pixels of the pixel as a pixel data piece, and performing variable-length coding based on the pixel data pieces that correspond to the pixels; and
   C) obtaining reduced sub-pixel data pieces by removing a part of the sub-pixel data pieces from the color-related data pieces based on the pixel-index data pieces;
   wherein the pixel-index data pieces and the reduced sub-pixel data pieces cooperatively replace the sub-pixel data pieces to serve as an index for finding the physical characteristics of the sub-pixels; and
   wherein step B) includes:
   classifying, for each of the sub-pixel colors, the sub-pixels of the sub-pixel color into multiple first data-processing groups based on the sub-pixel data pieces that correspond to the sub-pixels of the sub-pixel color, wherein a first one of the first data-processing groups includes those of the sub-pixels that have a highest frequency of occurrence among all of the sub-pixels of the sub-pixel color in terms of a value of the corresponding sub-pixel data pieces;

designating, for each of the sub-pixel colors, a first predetermined part of the sub-pixels of the sub-pixel color as belonging to the first one of the first data-processing groups;

generating, for each of the pixels, a first pixel classification data piece that indicates, for each of the sub-pixels of the pixel, which one of the first data-processing groups the sub-pixel belongs to; and performing the variable-length coding on the first pixel classification data pieces generated for the pixels, so as to generate the pixel-index data pieces;

wherein, in step C), the part of the sub-pixel data pieces corresponds to those of the sub-pixels in the first one of the first data-processing groups generated for each of the sub-pixel colors;

wherein the pixel-index data pieces generated in step B) serve as a first index data set, and the reduced sub-pixel data pieces obtained in step C) serve as a first reduced characteristic data set;

said method further comprising:

D) generating a second index data set by:

classifying, for each of the sub-pixel colors, the sub-pixels of the sub-pixel color into multiple second data-processing groups based on the sub-pixel data pieces that correspond to the sub-pixels of the sub-pixel color, wherein a first one of the second data-processing groups includes those of the sub-pixels that have a highest frequency of occurrence among all of the sub-pixels of the sub-pixel color in terms of the value of the corresponding sub-pixel data pieces;

designating, for each of the sub-pixel colors, a second predetermined part of the sub-pixels of the sub-pixel color as belonging to the first one of the second data-processing groups, wherein the first and second predetermined parts of the sub-pixels of the sub-pixel color are complementary with each other in terms of all of the sub-pixels of the sub-pixel color;

generating, for each of the pixels, a second pixel classification data piece that indicates, for each of the sub-pixels of the pixel, which one of the second data-processing groups the sub-pixel belongs to; and performing the variable-length coding on the second pixel classification data pieces generated for the pixels to generate the second index data set;

E) obtaining a second reduced characteristic data set by removing, based on the second index data set, a part of the sub-pixel data pieces, which corresponds to, for each of the sub-pixel colors, those of the sub-pixels in the first one of the second data-processing groups generated for the sub-pixel color, from the color-related data pieces received in step A);

F) transmitting, for each of the sub-pixel colors, the first index data set and the first reduced characteristic data set to a processor that performs data processing on a first part of an image for the sub-pixel color based on the first index data set and the first reduced characteristic data set; and G) transmitting, for each of the sub-pixel colors, the second index data set and the second reduced characteristic data set to another processor that performs data processing on a second part of the image for the sub-pixel color based on the second index data set and the second reduced characteristic data set;

wherein, for each of the sub-pixel colors, the first part of the image corresponds to the second predetermined part of the sub-pixels of the sub-pixel color, and the second part of the image corresponds to the first predetermined part of the sub-pixels of the sub-pixel color.

* * * * *